US010199257B2

(12) United States Patent
Potter et al.

(10) Patent No.: US 10,199,257 B2
(45) Date of Patent: Feb. 5, 2019

(54) FIXED POSITION MASK FOR WORKPIECE EDGE TREATMENT

(71) Applicant: Varian Semiconductor Equipment Associates, Inc., Gloucester, MA (US)

(72) Inventors: Fletcher Ian Potter, Beverly, MA (US); Philip Layne, Salem, MA (US); Keith A. Fernlund, Newburyport, MA (US); Michael Swears, Beverly, MA (US); Richard Allen Sprenkle, South Hamilton, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 0 days.

(21) Appl. No.: 15/605,106

(22) Filed: May 25, 2017

(65) Prior Publication Data

US 2018/0342413 A1 Nov. 29, 2018

(51) Int. Cl.

*H01L 21/687* (2006.01)
*H01L 21/68* (2006.01)
*H01L 21/67* (2006.01)
*H01L 21/02* (2006.01)

(Continued)

(52) U.S. Cl.

CPC .. *H01L 21/68764* (2013.01); *H01L 21/02021* (2013.01); *H01L 21/26506* (2013.01); *H01L 21/4871* (2013.01); *H01L 21/67213* (2013.01); *H01L 21/682* (2013.01); *H01L 21/68721* (2013.01); *H01L 21/68735* (2013.01)

(58) Field of Classification Search

CPC .................................................. H01L 21/68764

See application file for complete search history.

(56) References Cited

U.S. PATENT DOCUMENTS 9,583,309 B1 * 2/2017 Tye .................... H01J 37/3171
2006/0258128 A1 * 11/2006 Nunan .................... H01J 37/09
438/510

(Continued)

FOREIGN PATENT DOCUMENTS

JP 2004095906 A 3/2004

OTHER PUBLICATIONS

International Search Report and Written Opinion dated Aug. 9, 2018 for PCT/US2018/029005 filed Apr. 24, 2018.

*Primary Examiner* — Thomas Randazzo

(57) ABSTRACT

Embodiments of the disclosure include a fixed position mask for workpiece edge treatment. In some embodiments, an apparatus includes a roplat having a rotatable assembly, and a platen coupled to the rotatable assembly, wherein the platen is configured to hold a workpiece. The apparatus further includes a bracket affixed to the rotatable assembly, and a mask directly coupled to the bracket, wherein the mask is positioned adjacent the workpiece. The mask covers an inner portion of the platen and the workpiece, leaving just an outer circumferential edge of the workpiece exposed to an ion treatment. In some embodiments, the platen is permitted to rotate relative to the bracket during an ion treatment. In some embodiments, the mask includes a solid plate section devoid of any openings, and a mounting portion extending from the plate section, wherein the mounting portion is directly coupled to an extension arm of the bracket.

20 Claims, 9 Drawing Sheets

130 146 155 160 116 154 140 149 142 132 136 134

130 155 151 116 154 132 140 149 142 157 160 120 146 156 145 144 136 134

(51) Int. Cl.

| | |
|---|---|
| ***H01L 21/48*** | (2006.01) |
| ***H01L 21/265*** | (2006.01) |

(56) References Cited

U.S. PATENT DOCUMENTS

| | | | | |
|---|---|---|---|---|
| 2008/0073569 | A1* | 3/2008 | Teodorczyk | C23C 14/042 250/491.1 |
| 2010/0059362 | A1* | 3/2010 | Anella | C23C 14/042 204/192.11 |
| 2010/0171044 | A1 | 7/2010 | Lee et al. | |
| 2010/0308236 | A1* | 12/2010 | Carlson | H01J 37/3171 250/492.3 |
| 2011/0092059 | A1* | 4/2011 | Daniels | H01J 37/3171 438/531 |
| 2012/0003815 | A1 | 1/2012 | Lee | |
| 2017/0025253 | A1* | 1/2017 | Amato | H01J 37/08 |

* cited by examiner

FIXED POSITION MASK FOR WORKPIECE EDGE TREATMENT

FIELD

Embodiments of the present disclosure relate to approaches for selectively processing a workpiece and, more particularly, to selectively processing an outer portion of a semiconductor workpiece using a fixed position mask.

BACKGROUND

Improved yields for semiconductor devices is an on-going goal. One area for improvement is process uniformity across the workpiece in the radial direction. In certain processes, the workpiece may receive more treatment near the workpiece center. For example, a deposition process may deposit more material near the center of a workpiece than near the outer edge of the workpiece. This may be due to the increased plasma density near the center of the deposition chamber.

As another example, a heated implant may provide a different dose near the outer edge, since the outer edge of the workpiece may be somewhat cooler than the rest of the workpiece. In yet another example, a spin coating process may leave more material near the outer edge of the workpiece, as compared to the workpiece center, due to the centripetal force pushing the coating toward the outer edge of the workpiece.

In these examples, process non-uniformity in the radial direction may negatively impact the yield of a semiconductor workpiece. In some cases, efforts are made to improve the uniformity of the process. Yet, there may be limits to the degree of uniformity achieved.

With respect to these and other considerations the present disclosure is provided.

BRIEF SUMMARY

In view of the foregoing, embodiments of the present disclosure provide techniques for selectively processing just an outer portion of a workpiece using a fixed position mask to improve process uniformity.

In one embodiment according to the disclosure, an apparatus may include a roplat having a rotatable assembly, and a platen and a bracket coupled to the rotatable assembly, wherein the platen is configured to hold a workpiece. The apparatus may further include a mask directly coupled to the bracket. The mask is positioned adjacent the platen, wherein the mask covers an inner portion of the platen, leaving just an outer circumferential edge of the workpiece exposed to an ion treatment.

In another embodiment according to the disclosure, a mask assembly may include a bracket affixed to a rotatable assembly of a roplat, and a mask directly coupled to the bracket. The mask is positioned adjacent a platen capable of supporting a workpiece, wherein the mask covers an inner portion of the workpiece, leaving just an outer circumferential edge of the workpiece exposed to an ion treatment.

In yet another embodiment according to the disclosure, a method may include providing a platen coupled to a rotatable assembly of a roplat, the platen configured to hold a workpiece. The method may further include providing a bracket affixed to the rotatable assembly, and then positioning a mask adjacent the platen. The mask is directly coupled to the bracket, wherein the mask covers an inner portion of the platen and the workpiece, leaving just an outer circumferential edge of the workpiece exposed to an ion treatment.

BRIEF DESCRIPTION OF THE DRAWINGS

The accompanying drawings illustrate example approaches of the disclosure, including the practical application of the principles thereof, as follows.

Figure 1:
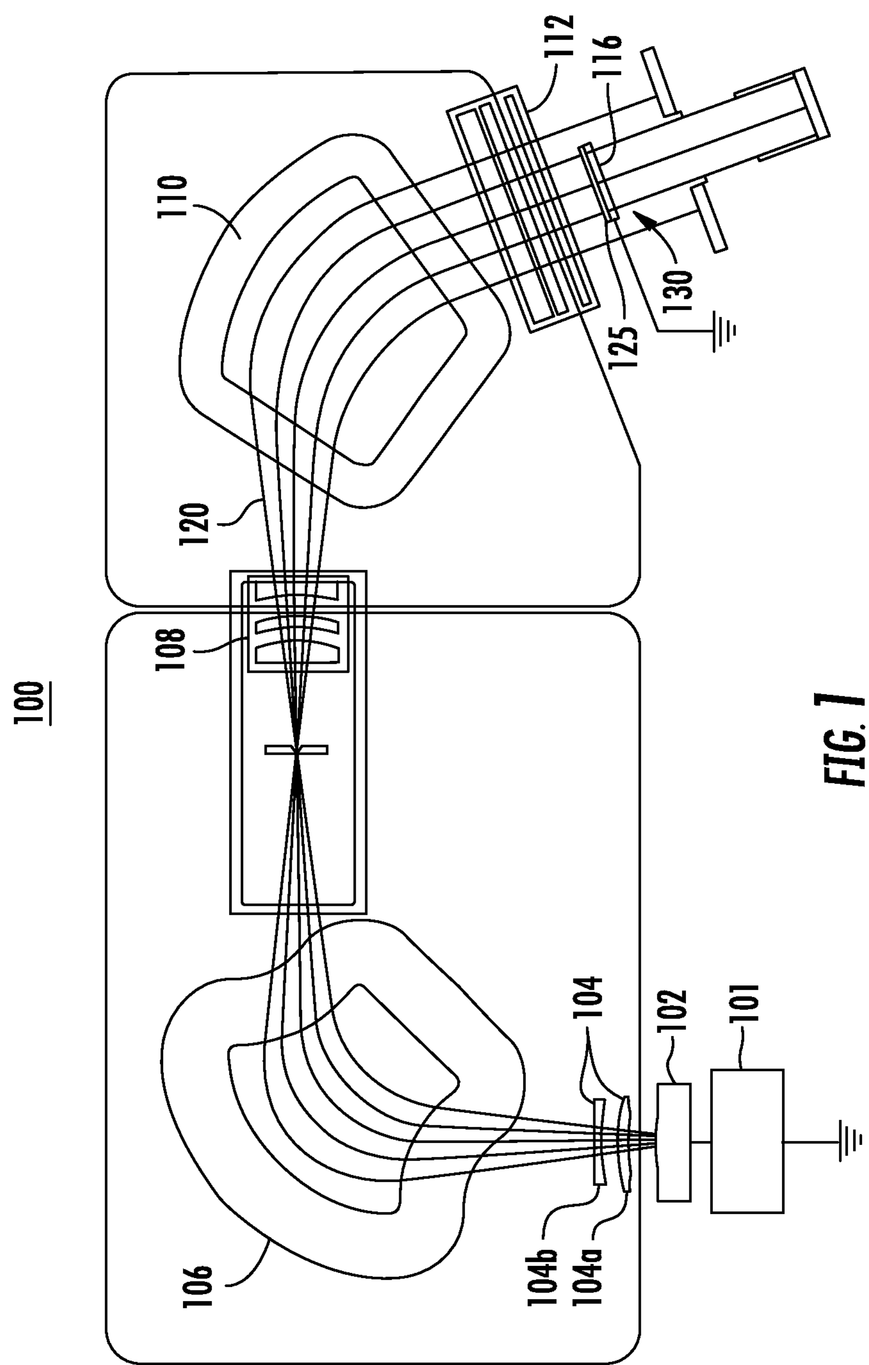
FIG. 1 is a schematic view illustrating an ion implantation system in accordance with embodiments of the present disclosure.

The drawings are not necessarily to scale. The drawings are merely representations, not intended to portray specific parameters of the disclosure. The drawings are intended to depict example embodiments of the disclosure, and therefore are not be considered as limiting in scope. In the drawings, like numbering represents like elements.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

As used herein, an element or operation recited in the singular and proceeded with the word "a" or "an" are understood as possibly including plural elements or operations, except as otherwise indicated. Furthermore, various embodiments herein have been described in the context of one or more elements or components. An element or component may comprise any structure arranged to perform certain operations. Although an embodiment may be described with a limited number of elements in a certain topology by way of example, the embodiment may include more or less elements in alternate topologies as desired for a given implementation. Note any reference to "one embodiment" or "an embodiment" means a particular feature, structure, or characteristic described in connection with the embodiment is included in at least one embodiment. The appearances of the phrases "in one embodiment," "in some embodiments," and "in various embodiments" in various places in the specification are not necessarily all referring to the same embodiment.

Embodiments of the disclosure include a fixed position mask for workpiece edge treatment. In some embodiments, an apparatus includes a roplat having a rotatable assembly, and a platen coupled to the rotatable assembly, wherein the platen is configured to hold a workpiece. The apparatus further includes a bracket affixed to the rotatable assembly, and a mask directly coupled to the bracket. The mask is positioned adjacent the platen, and wherein the mask covers an inner portion of the platen and workpiece, leaving just an outer circumferential edge of the workpiece exposed. In some embodiments, the platen is permitted to rotate relative to the bracket during an ion treatment (e.g., implantation or sputtering). In some embodiments, the mask includes a solid plate devoid of any openings, and a mounting portion extending from the plate section, wherein the mounting portion is directly coupled to an extension arm of the bracket.

Apparatuses and methods of the present disclosure permit selective implanting of just the outer portion of the work-piece/workpiece. The mask is disposed between the ion beam and the workpiece, and is slightly smaller than the workpiece. The mask is affixed to a center block of the roplat by the bracket so the platen is free to rotate between a load/unload position and an operational position without moving the mask. In certain embodiments, the mask and/or the bracket are shaped so as not to interfere with the rotation of the platen. In other embodiments, the mask may be affixed to the arms of the roplat.

The outer portion of the workpiece/workpiece may be an annular ring, where the outer dimension of the annular ring is the circumference of the workpiece. For example, if the workpiece has a diameter of 300 mm, the annular ring may have an outer diameter of 300 mm and an inner diameter slightly less than 300 mm. The annular ring may be tens of millimeters in width, or may be just a few millimeters. In other words, the width of the annular ring may vary and is not limited by this disclosure.

In some embodiments, the assembly further includes a processing component as part of a device, such as a computing device. The processing component may communicate positional data with an imaging device (e.g., video or still camera) to precisely place the workpiece with respect to the mask within a set accuracy window. For example, the processing component is configured to receive the positional data from the imaging device to calculate a mask center. A workpiece center is separately calculated, and the workpiece is then brought into position atop the platen, beneath the mask, by aligning the mask center with the workpiece center.

Referring now to FIG. 1, an example beamline ion implantation system 100 used to perform the selective processing of an outer portion of a workpiece according to embodiments of the disclosure will be described in greater detail. As illustrated, the beamline ion implantation system 100 may include an ion source and a series of beam-line components, an ion beam passing through the beam-line components. The ion source may comprise an ion source chamber 102 where ions are generated. The ion source may also comprise a power source 101 and an extraction electrode 104 disposed near the ion source chamber 102. The extraction electrodes 104 may include a suppression electrode 104*a* and a ground electrode 104*b*. The ion source chamber 102, the suppression electrode 104*a*, and the ground electrode 104*b* may include an aperture. The ion source chamber 102 may include an extraction aperture (not shown), the suppression electrode 104*a* may include a suppression electrode aperture (not shown), and the ground electrode 104*b* may include a ground electrode aperture (not shown). The apertures may be in communication with one another so as to allow the ions generated in the ion source chamber 102 to pass through, and toward the beam-line components.

The beamline components may include, for example, a mass analyzer 106, a first acceleration or deceleration stage 108, a collimator 110, and a second acceleration or deceleration stage 112. Much like a series of optical lenses manipulating a light beam, the beamline components can filter, focus, and manipulate ions or ion beam 120. The ion beam 120 passing through the beamline components may be directed toward a workpiece 125 (also referred to as a "wafer") mounted on a platen 116 or clamp of an assembly 130. The workpiece 125 may be moved in one or more dimensions by an apparatus, hereinafter referred to as a "roplat." The roplat may be configured to rotate the workpiece 125 around a center point of the workpiece 125, and to move the workpiece 125 so the ion beam 120 is directed to a specific region of the workpiece 125 and/or to the entire workpiece 125.

For example, the ion beam 120 may directed toward the workpiece 125, so the ion beam 120 extends across the workpiece 125, forming the geometric line referred to as a chord. The ion beam 120 may be a ribbon ion beam, having a length much greater than a width. For example, the length of the ion beam 120 may be several hundred millimeters, while the width of the ion beam 120 may be approximately ten millimeters. The ion beam 20 may be straight along the length direction. Of course, other dimensions may also be used and are within the scope of the disclosure.

Figure 2:
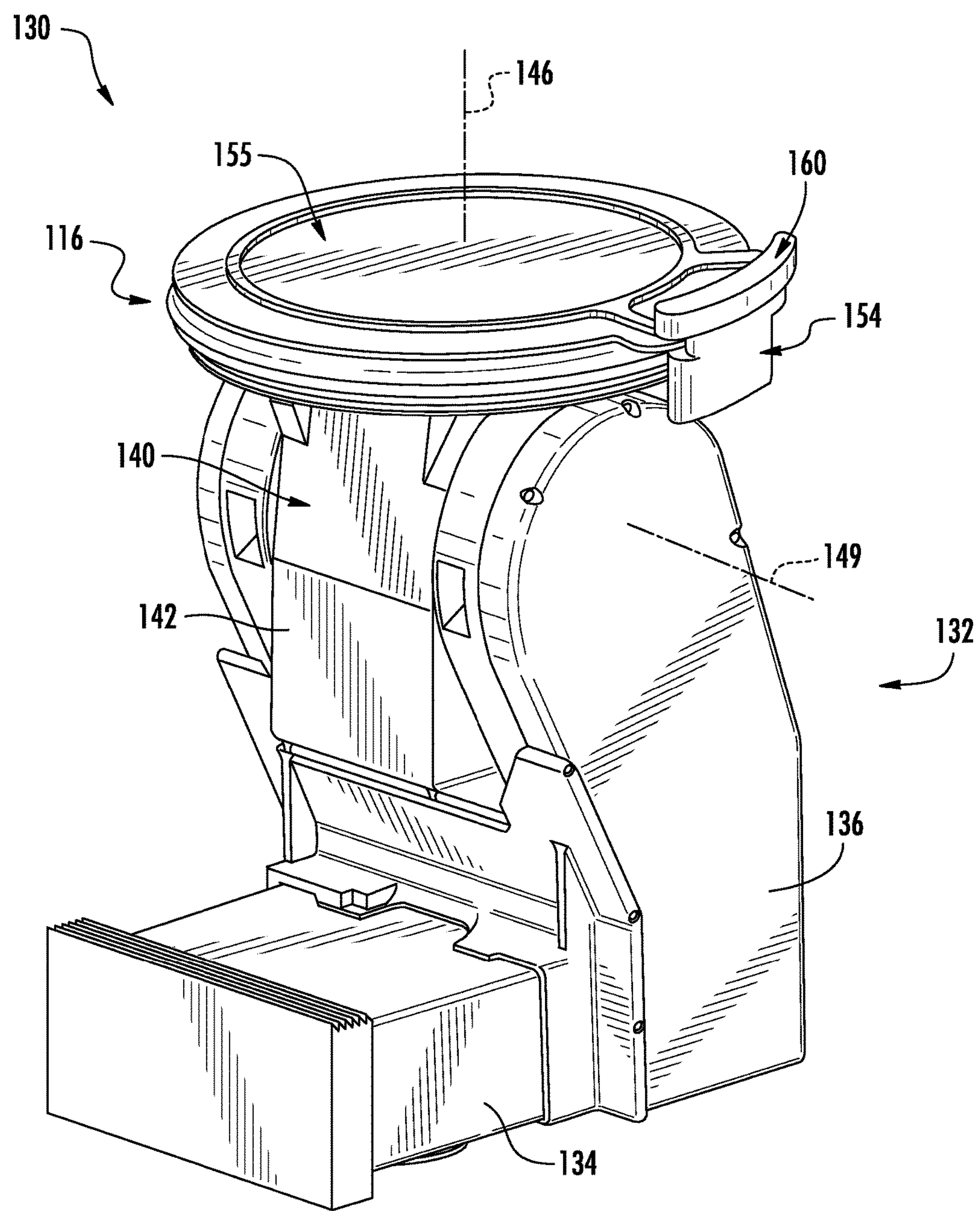
FIG. 2 is a perspective view illustrating an apparatus in accordance with embodiments of the present disclosure.
Figure 3:
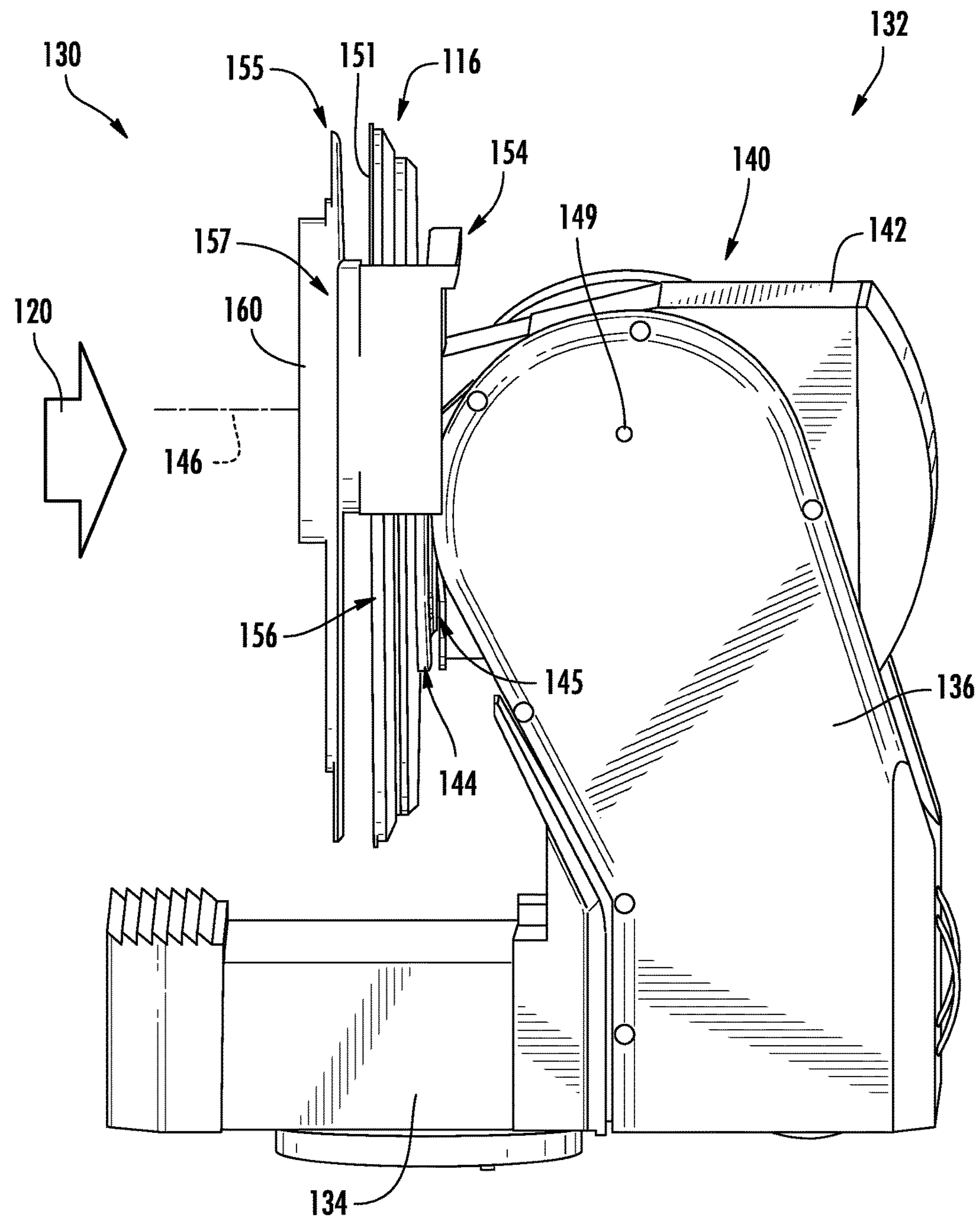
FIG. 3 is a side view illustrating an apparatus in accordance with embodiments of the present disclosure.

Turning now to FIGS. 2-3, the assembly 130 for selectively processing the outer portion of the workpiece according to embodiments of the disclosure will be described in greater detail. The assembly 130 includes the roplat 132 including a base 134 coupled to two upward extending side arms 136, spaced apart from one another. A rotatable assembly 140 is disposed in the space between the side arms 136 and is rotatably attached to the side arms 136. More specifically, a center block 142 of the rotatable assembly 140 is coupled between the side arms 136. The platen 116 is provided to hold a workpiece (not shown), the platen 116 being coupled to the center block 142 by a platen adaptor plate 144 coupled to a mounting plate 145, wherein the platen adaptor plate 144 supports the platen 116. In some embodiments, the platen 116 may be an electrostatic chuck, capable of clamping a workpiece in place through the use of electrostatic force. A first motor (not shown) may be disposed within the rotatable assembly 140 to allow the platen 116 to rotate/spin around an axis 146, wherein the axis 146 is perpendicular to the plane of the platen 116 and passes through the center of the platen 116.

A second motor (not shown) may be disposed within the roplat 132, such as within the center block 142 or within the side arms 136. The second motor allows rotation of the rotatable assembly 140 around a second axis 149. The second axis 149 may be horizontal, and oriented perpendicular to the axis 146. The rotatable assembly 140 may be capable of at least 90° of rotation. For example, the roplat 132 has a first position, shown in FIG. 2, known as the load/unload position, where the rotatable assembly 140 is oriented so the platen 116 is horizontal or approximately horizontal. While in this load/unload position, the workpiece may be placed on the platen 116, and, after processing, subsequently may be removed from the platen 116. The roplat 132 also has a second position, shown in FIG. 3, known as the operational position, where the rotatable assembly 140 is oriented so the platen 116 is vertical or approximately vertical. In this operational position, the platen 116 and the clamped workpiece are facing the ion beam 120 being directed toward the platen 116. In other words, a plane formed by a surface 151 of the platen 116 is perpendicular to the ion beam 120 when the roplat 132 is in the position shown in FIG. 3.

The assembly 130 further includes a bracket 154 affixed to the center block 142 of the rotatable assembly 140, and a mask 155 directly coupled to the bracket 154. As shown, the mask 155 is positioned adjacent the platen 116 to cover an inner portion 156 of the platen 116 and the workpiece, leaving an outer circumferential edge of the workpiece exposed to the ion beam 120 during an ion treatment. The mask 155 may be supported in a position apart from the platen 116 by a mounting portion 160 coupled to the bracket 154, as will be described in greater detail below. The mask 155 may be affixed to the bracket 154 in such a way so the platen 116 is free to rotate around the axis 146 and the second axis 149 without contacting the mask 155 or bracket 154. Together, the mask 155 and the bracket 154 may constitute a mask assembly 157.

In various embodiments, the mask 155 is a solid piece of material (e.g., graphite, aluminum or other suitable material) devoid of any openings formed therethrough so as to block ions from reaching the central area of the workpiece. In the operational position, shown in FIG. 3, the ion beam 120 is directed toward the workpiece and is permitted to treat/impact just the outer circumferential edge of the workpiece left exposed by the mask 155. To treat/implant the entirety of the outer portion of the workpiece, the platen 116 is rotated around the axis 146 while the ion beam 120 is being directed toward the roplat 132.

The dose implanted into the outer portion of the workpiece may be controlled in a variety of ways. For example, in one embodiment, the rotational speed of the platen 116 around the axis 146 is set so as to achieve the desired implant dose in just one rotation. The rotational speed may be determined based on a previously measured ion beam current. For example, a calibration process may be performed prior to executing a treatment sequence. In this calibration process, the ion beam current may be measured, such as by using a Faraday cup. Based on the measured ion beam current, the rotational speed of the platen 116 may be determined. As stated above, in certain embodiments, the rotational speed is determined so the desired dose is implanted during one rotation of the platen 116. Yet in other embodiments, the rotational speed may be determined in conjunction with a desired number of platen rotations. For example, the platen 116 may be rotated at twice the angular speed if the workpiece is implanted during two rotations.

In certain embodiments, the platen 116 may be able to rotate around axis 146 with a range of slightly more than 360°. As such, multiple rotations may be achieved by first rotating the platen 116 in a first direction, such as clockwise, for the first rotation. A second rotation is then performed in the opposite second direction, such as counterclockwise. This alternating pattern can be repeated for the desired number of rotations.

Figure 4:
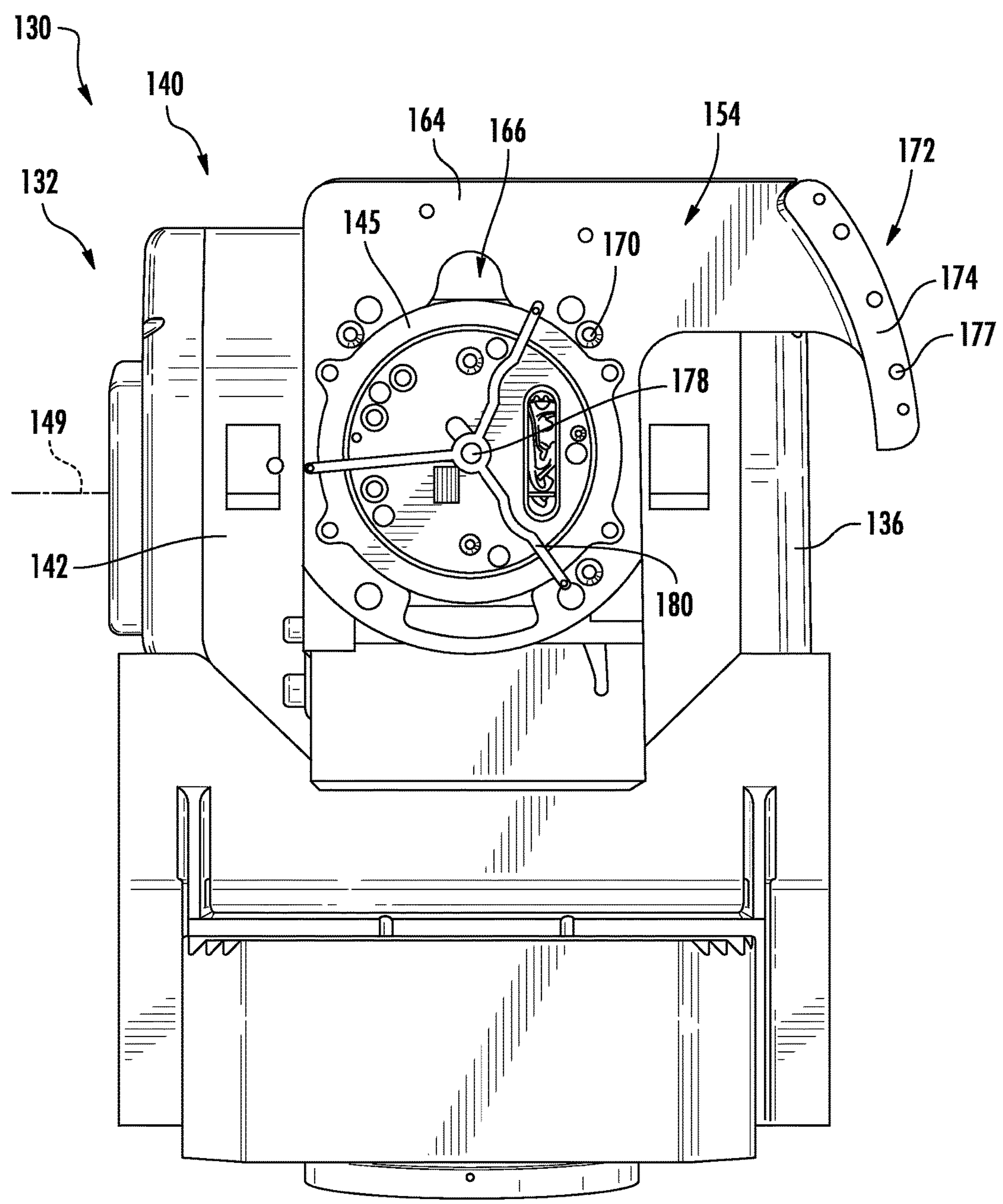
FIG. 4 is a front view illustrating an apparatus in accordance with embodiments of the present disclosure.
Figure 5:
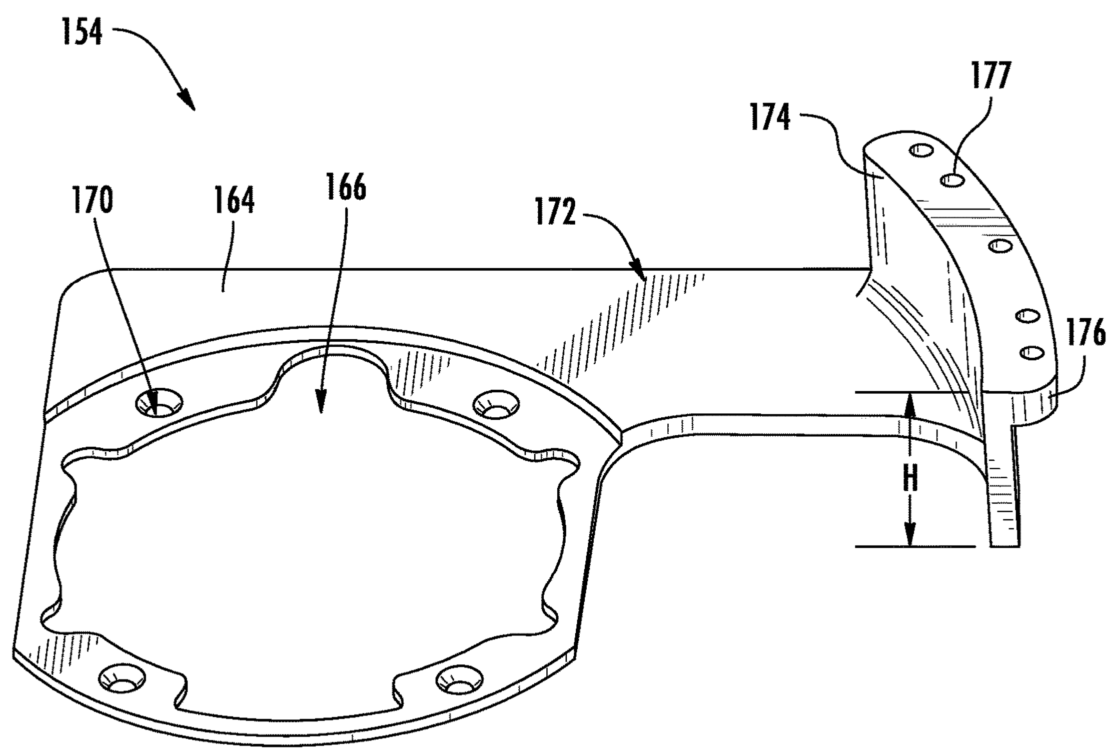
FIG. 5 is a perspective view illustrating a bracket in accordance with embodiments of the present disclosure.

Turning now to FIGS. 4-5, the bracket 154 according to embodiments of the disclosure will be described in greater detail. For ease of viewing, FIG. 4 demonstrates the assembly 130 with the mask 155, the platen 116, and the platen adaptor plate 144 removed. As shown, the bracket 154 includes a main body 164, and a central opening 166 formed through the main body 164. The central opening 166 is dimensioned so as to surround the mounting plate 145 coupled to the center block 142 of the rotatable assembly 140. A plurality of fastener openings 170 are provided around the central opening 166 for securing the main body 164 to the center block 142.

As further shown, the bracket 154 includes an extension arm 172 extending from the main body 164. The extension arm 172 may extend laterally away main body 164, for example, along a direction parallel to the second axis 149. In some embodiments, the extension arm 172 extends beyond one of the side arms 136 to accommodate for the size of the workpiece/platen being used. The extension arm 172 further includes a support wall 174 at an outer end, the support wall 174 generally oriented perpendicular to the main body 164 (e.g., along the axis 146). As shown, the support wall 174 has a height 'H' to separate the mask 155 from the workpiece and platen 116. In some embodiments, the support wall 174 has a flange 176 including a plurality of openings 177 formed therein to receive a set of fasteners (not shown) for coupling the support wall 174 to the mask 155. In some embodiments, the bracket 154 has just one extension arm 172 and support wall 174 to contact the mask 155 at a lone spot. By minimizing the number of support features coupling the bracket and the mask, more of the outer circumferential edge of the workpiece can be simultaneously be impacted by an ion treatment.

The rotatable assembly 140 may further include a shaft 178 coupling the center block 142 to the platen adaptor plate 144 and to the platen 116 (FIGS. 1-3). The shaft 178 extends along the axis 146, and passes through the mounting plate 145 and the bracket 154. In some embodiments, a keying feature 180 may be coupled to and extend from the shaft 178. The keying feature 180 may be a 3-pronged component capable of nesting within corresponding channels (not shown) in the platen 116 to better transfer the torque from the shaft 178 to the platen 116.

Figure 6:
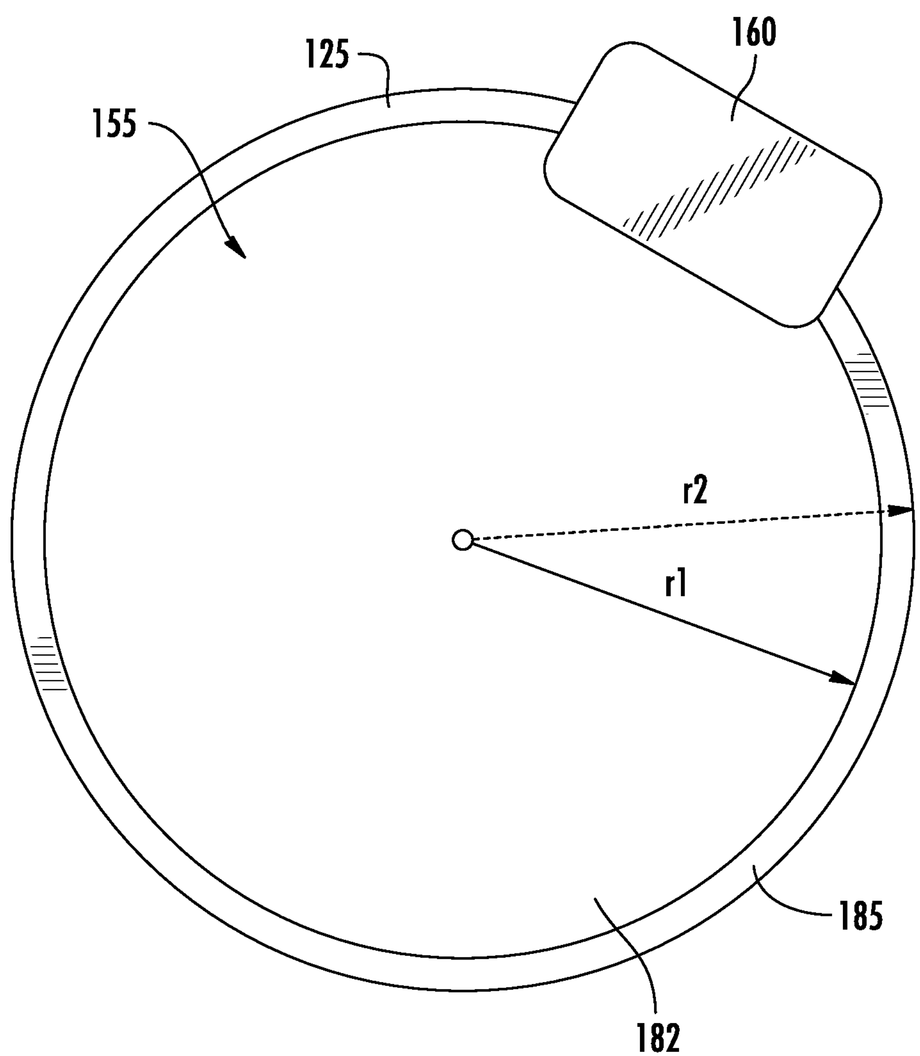
FIG. 6 is a top view illustrating a mask and a workpiece in accordance with embodiments of the present disclosure.

Turning now to FIG. 6, the mask 155 according to embodiments of the disclosure will be described in greater detail. As shown, the mask 155 may include a plate section 182, and the mounting portion 160 extending from the plate section 182. The mounting portion 160 is directly coupled to the support wall 174 of the extension arm 172 (FIG. 5). As shown, the plate section 182 is generally round so as to correspond to the shape of the workpiece 125. In other embodiments, the plate section 182 may take any various other shapes. As shown, the plate section 182 is smaller than the workpiece 125 to permit the outer circumferential edge 185 of the workpiece 125 left exposed by the plate section 182 to be impacted by an ion treatment, such as an ion implant and/or ion sputtering. Said another way, a radius 'r1' of the plate section 182 is less/shorter than a radius 'r2' of the platen and/or workpiece 125. In some embodiments, r2 is between 2 mm-20 mm longer than r1. As shown, the mounting portion 160 may cover a section of the outer circumferential edge 185. In some embodiments, the mounting portion 160 covers less than 20% of the outer circumferential edge 185 so as to allow ions to impact as much of the outer circumferential edge 185 as possible. During treatment, rotating the platen/workpiece 125 relative to the mask 155 permits all of the outer circumferential edge 185 to be treated equally or approximately equally by the ion beam 120 (FIG. 3). In some embodiments, the workpiece 125 may remain on the platen throughout all of the treatment process, without having to be removed.

Figure 7:
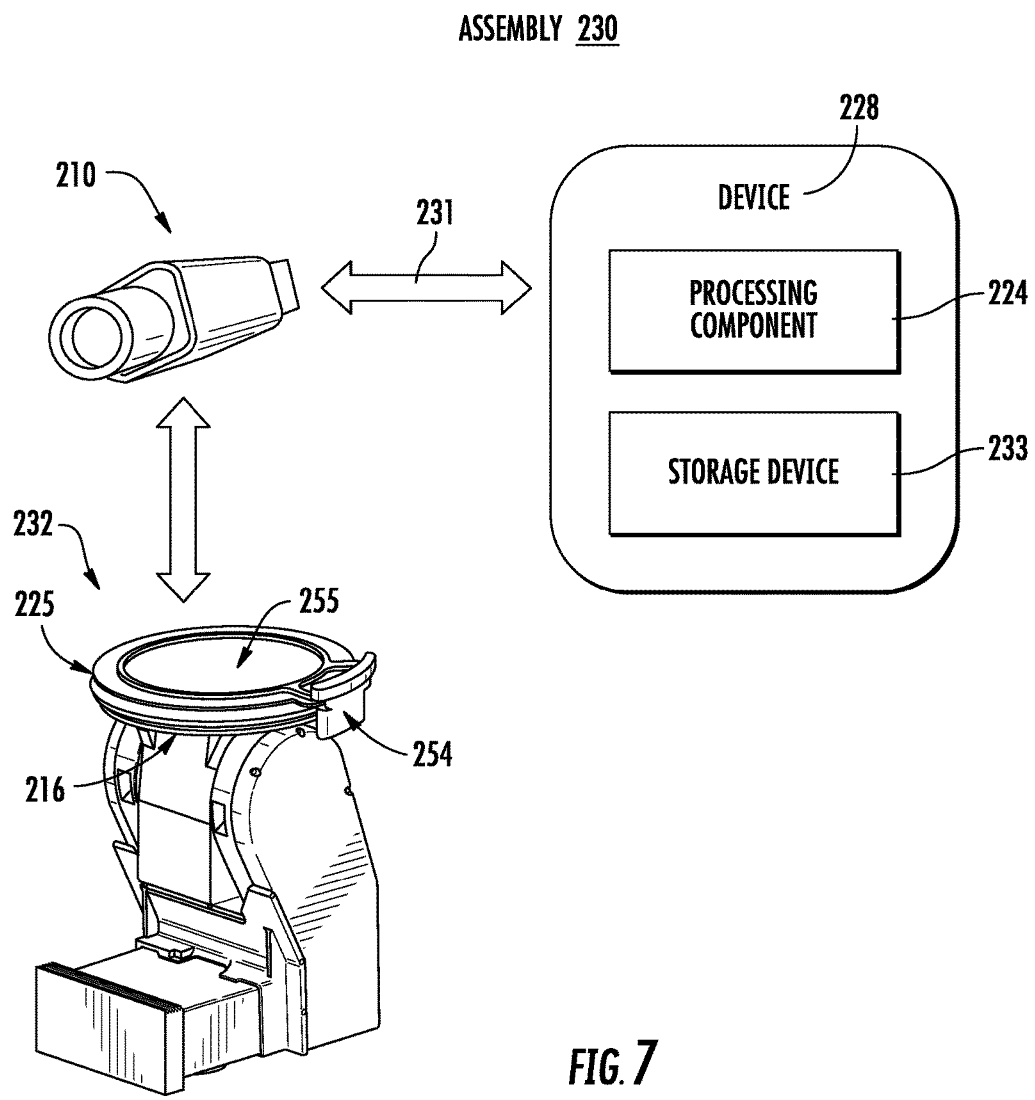
FIG. 7 is a schematic view illustrating an apparatus in accordance with embodiments of the present disclosure.

Turning now to FIG. 7, an assembly 230 according to embodiments of the disclosure will be described in greater detail. As shown, the assembly 230 includes a roplat 232, such as the roplat 132 described above. As such, just certain aspects of the roplat 232 will hereinafter be described for the sake of brevity. The assembly 230 further includes one or more imaging devices 210, such as a video camera or a still camera, used to ensure proper alignment between a mask 255 and a workpiece 225 of the roplat 232. The imaging device 210 may be mounted proximate a window of a chamber (not shown) containing the roplat 232. One or more light sources may be coupled to the chamber to enable the imaging device 210 to adequately capture positional information of components of the roplat 232. For example, in one non-limiting embodiment, the imaging device 210 may be mounted proximate a top chamber window, while the light source is coupled to a chamber door containing a window.

In some embodiments, the assembly 230 further includes a processing component 224 as part of a device 228, such as a computing device. The processing component 224 communicates positional and dimensional data 231 with the imaging device 210 to precisely place the workpiece 225 with respect to the mask 255 within a set accuracy window. For example, the processing component 224 is configured to recognize visual attributes of workpiece 225 and the mask 255 including, but not limited to, appearance, color, texture, gradients, edge detection, motion characteristics, shape, spatial location, etc. From these attributes of the positional and dimensional data 231, the processing component 224 is configured to calculate a mask center 255. A workpiece center 225 may be separately calculated, and the workpiece 225 is then brought into position atop the platen 216, beneath the mask 255, by aligning the mask center 255 with the workpiece center 225. In some embodiments, a center of the platen 216 may also be separately calculated, wherein the workpiece 225 is first brought into central alignment with the platen 216 before being aligned with the mask 255. Positional and dimensional data 231 for the mask 255, the workpiece 225, and/or the platen 216 may be stored within a storage device 233.

In exemplary embodiments, the mask 255 remains affixed to the bracket 254 while the workpiece 225 is manipulated into position. Once the workpiece 225 is placed atop the platen 216, the imaging device 210 may again observe a position of the mask 255 relative to the workpiece 225, for example, by measuring a distance between an edge of the mask 255 and an edge of the workpiece 225 at multiple points along the perimeter of the workpiece 225. The processing component 224 may then send an instruction to the ion source of the ion implantation system 100 (FIG. 1) to deliver the ion beam 120 to the roplat 232.

One will appreciate the device 228 may be any electronic device capable of receiving, processing, and sending information for accurately positioning the workpiece 225 with respect to the mask 255. Examples of an electronic device may include without limitation a computer, a personal computer (PC), a desktop computer, a laptop computer, a notebook computer, a netbook computer, a handheld computer, a tablet computer, a server, a server array or server farm, a web server, a network server, an Internet server, and a work station. Examples of an electronic device may also include a main frame computer, a supercomputer, a network appliance, a web appliance, a distributed computing system, and multiprocessor systems. Examples of an electronic device may also include processor-based systems, wireless access point, base station, subscriber station, radio network controller, router, hub, gateway, bridge, switch, machine, or combination thereof. The embodiments herein are not limited in this context.

The device 228 may execute processing operations or logic using the processing component 224. The processing component 224 may comprise various hardware elements, software elements, or a combination of hardware/software. Examples of hardware elements may include devices, logic devices, components, processors, microprocessors, circuits, processor circuits, circuit elements (e.g., transistors, resistors, capacitors, inductors, and so forth), integrated circuits, application specific integrated circuits (ASIC), and programmable logic devices (PLD). Examples of hardware elements may also include digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, and functions. Examples of software elements may also include methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

In some embodiments, the device 228 may execute communication operations or positional determinations using a communications component (not shown). The communications component may implement any well-known communications techniques and protocols, such as techniques suitable for use with packet-switched networks (e.g., public networks such as the Internet, private networks such as an enterprise intranet, and so forth). The techniques and protocols may further be suitable for circuit-switched networks (e.g., the public switched telephone network), or a combination of packet-switched networks and circuit-switched networks (with suitable gateways and translators). The communications component may include various types of standard communication elements, such as one or more communications interfaces, network interfaces, network interface cards (NIC), radios, wireless transmitters/receivers (transceivers), wired and/or wireless communication media, physical connectors, and so forth. By way of example, and not limitation, communication media may include wired communications media and wireless communications media. Examples of wired communications media may include a wire, cable, metal leads, printed circuit boards (PCB), backplanes, switch fabrics, semiconductor material, twisted-pair wire, co-axial cable, fiber optics, a propagated signal, and so forth. Examples of wireless communications media may include acoustic, radio-frequency (RF) spectrum, infrared and other wireless media. The device 228 may communicate with other devices (not shown) via a Cloud. In some embodiments, the storage device 233 includes volatile or non-volatile storage including a set of instructions for operating the processing component 224.

Figure 8:
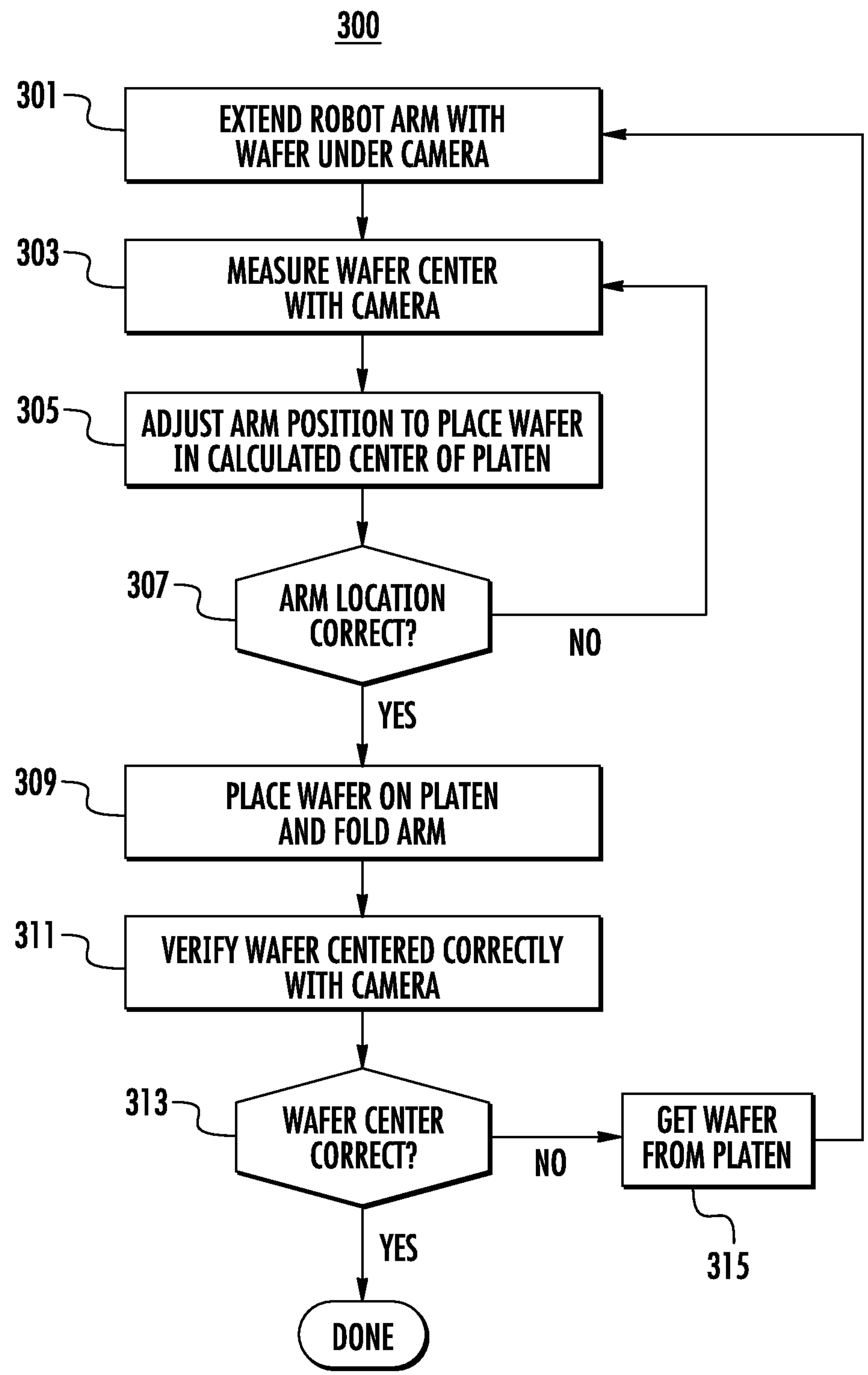
FIG. 8 illustrates a flowchart for performing methods in accordance with embodiments of the present disclosure.

Turning now to FIG. 8, a logic process flow 300 for providing workpiece edge treatment according to embodiments of the disclosure will be described in greater detail. At 301, a robot arm including a workpiece is extended to a position beneath a camera for positional and dimensional data observation and extraction. At 303, a workpiece center is determined using the camera. At 305, arm position is adjusted to place the workpiece in a calculated center of a platen. At 307, a determination is made whether the arm location is correct. If the arm location is incorrect, the workpiece center is measured again. If the arm location is correct, at 309 the workpiece is placed on the platen and the arm is folded/removed. At 311, the camera sends data to a processing component to verify the workpiece is centered correctly with respect to a center of a mask and/or a center of the platen. At 313, a determination is made if the workpiece is centered correctly. If the workpiece is not centered correctly, at 315 the arm removes the workpiece from the platen. If the workpiece center is correct, positioning of the workpiece relative to the mask is satisfied, and treatment of the workpiece may commence.

Figure 9:
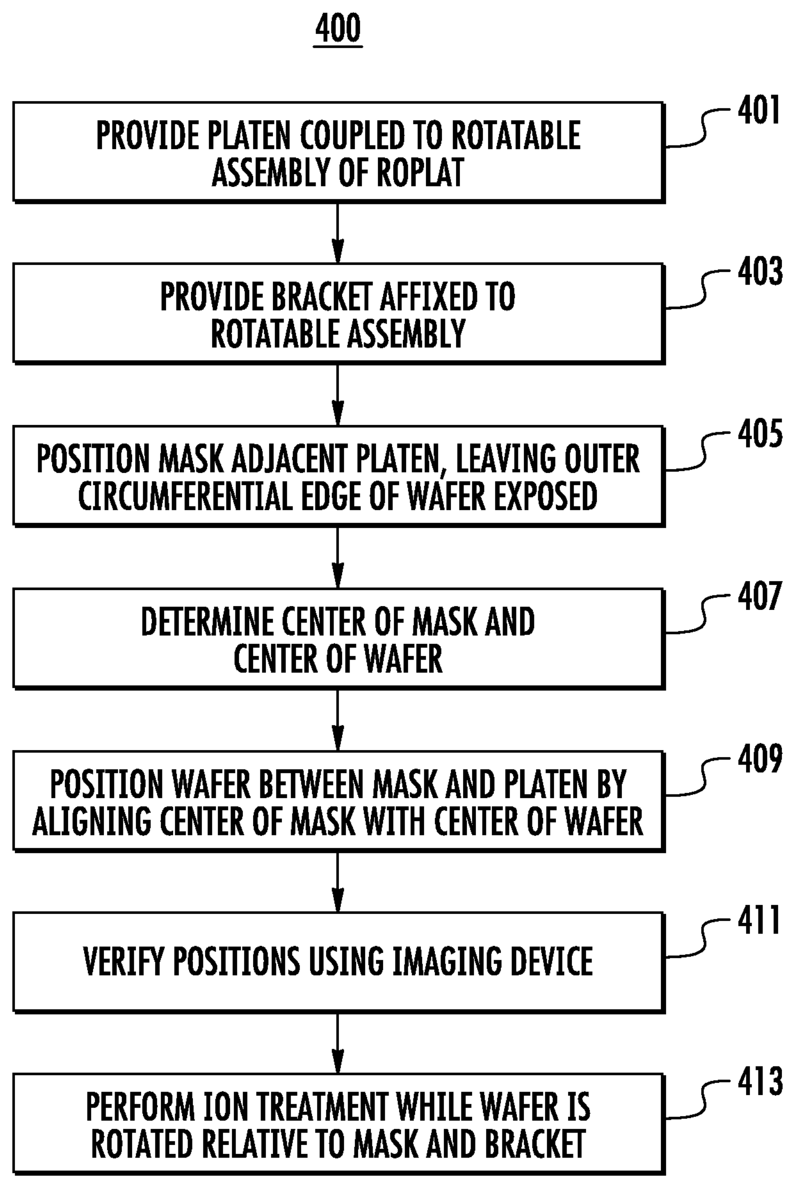
FIG. 9 illustrates a flowchart for performing methods in accordance with embodiments of the present disclosure.

Turning now to FIG. 9, a logic process flow 400 for providing workpiece edge treatment according to embodiments of the disclosure will be described in greater detail. At 401, a platen is coupled to a rotatable assembly of a roplat, the platen configured to hold a workpiece. In some embodiments, the roplat may include a base coupled to two upward extending side arms spaced apart from one another. The rotatable assembly is rotatably attached to the side arms. A center block of the rotatable assembly is coupled between the side arms. The platen is provided to hold a workpiece, the platen being coupled to the center block by a platen adaptor plate coupled to the mounting plate, wherein the platen adaptor plate supports the platen.

At 403, a bracket is provided affixed to the rotatable assembly. In some embodiments, the bracket includes a main body and a central opening 166 formed through the main body. The central opening is dimensioned so as to surround a mounting plate coupled to the center block of the rotatable assembly. A plurality of fastener openings of the bracket are provided around the central opening for securing the main body to the center block. The bracket further includes an extension arm extending from the main body. The extension arm may extend laterally away main body, for example, along a direction parallel to the second axis. The extension arm further includes a support wall at an outer end, the support wall generally oriented perpendicular to the main body, wherein the support wall is directly coupled to a mask.

At 405, a mask is positioned adjacent the platen, wherein the mask covers an inner portion of the platen, leaving just an outer circumferential edge of the workpiece exposed. In some embodiments, the mask is directly coupled to the bracket. The mask may be supported in a position apart from the platen by a mounting portion coupled to the bracket, wherein the mounting portion extends from a plate section of the mask. In exemplary embodiments, the mask may be affixed to the bracket in such a way so the platen is free to rotate without contacting the mask or bracket.

At 407, a mask center and a workpiece center are determined. In some embodiments, an imaging device (e.g., camera) may be used to determine the mask center and the workpiece center. In some embodiments, the imaging device operates with a processing component. Next, at 409, the workpiece is positioned between the mask and the platen, wherein the mask center is aligned with the workpiece center.

At 411, the imaging device and the processing component may verify the mask center is aligned with the workpiece center using an imaging device. At 413, an ion treatment to the exposed outer circumferential edge of the workpiece may be performed while the workpiece and the platen are rotated relative to the mask and the bracket.

In summation, embodiments described herein may have many advantages. As described above, many semiconductor processes exhibit some non-uniformity along the radial direction. The approaches described herein advantageously provide a way to selective process the outer portion of the workpiece to compensate for and/or counteract these non-uniformities. Furthermore, certain embodiments described above advantageously include a camera in proximity to the roplat, e.g., mounted on a top process chamber window. The camera operates with software of a processing component to determine a workpiece center and the mask. Once a workpiece is on the robot arm the processing component compares the real position with the desired position and makes any desired position correction. Placement accuracy of +−0.5 mm or better may be achieved.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. An apparatus comprising:

a roplat including a rotatable assembly;

a platen and a bracket coupled to the rotatable assembly, the platen configured to hold a workpiece, and the bracket directly coupled to the rotatable assembly; and a mask directly coupled to the bracket, wherein the mask is positioned adjacent the platen to cover an inner portion of the workpiece and to leave just an outer circumferential edge of the workpiece exposed to an ion treatment.

2. The apparatus of claim 1, the rotatable assembly comprising:

a center block supported by a side arm, the center block including a mounting plate; and a platen adaptor plate coupled to the mounting plate, the platen adaptor plate supporting the platen.

3. The apparatus of claim 2, wherein the bracket surrounds the mounting plate.

4. The apparatus of claim 2, the rotatable assembly further comprising a shaft coupling the center block to the platen adaptor plate, wherein the shaft extends through the mounting plate and the bracket.

5. The apparatus of claim 4, wherein the shaft permits the platen to rotate relative to the mounting plate and to the bracket.

6. The apparatus of claim 1, the bracket comprising:

a main body;

a central opening formed through the main body; and an extension arm extending from the main body, the extension arm including a support wall oriented perpendicular to the main body.

7. The apparatus of claim 6, wherein the main body is directly affixed to the rotatable assembly.

8. The apparatus of claim 6, wherein the mask comprises:

a plate section; and a mounting portion extending from the plate section, wherein the mounting portion is directly coupled to the support wall of the extension arm.

9. The apparatus of claim 8, wherein the plate section does not include any openings.

10. The apparatus of claim 1, further comprising:

an imaging device adjacent the roplat; and a processing component in communication with the imaging device, the processing component operable to:

calculate a mask center and a workpiece center based on positional and dimensional data obtained by the imaging device; and enable alignment of the mask center with the workpiece center.

11. A mask assembly comprising:

a bracket directly affixed to a rotatable assembly of a roplat; and a mask directly coupled to the bracket, wherein the mask is positioned adjacent a platen supporting a workpiece, and wherein the mask covers an inner portion of the workpiece, leaving just an outer circumferential edge of the workpiece exposed to an ion treatment.

12. The mask assembly of claim 11, the bracket comprising:

a main body;

a central opening formed through the main body; and an extension arm extending from the main body, the extension arm including a support wall oriented perpendicular to the main body.

13. The mask assembly of claim 12, wherein the mask comprises:

a plate section; and a mounting portion extending from the plate section, wherein the mounting portion is directly coupled to the support wall of the extension arm.

14. The mask assembly of claim 13, wherein the plate section is a solid, circular shaped piece of material devoid of any openings.

15. The mask assembly of claim 13, wherein a radius of the plate section is less than a radius of the wafer.

16. The mask assembly of claim 11, wherein the bracket and the mask are not directly coupled to the platen to permit rotation of the platen relative to the bracket and the mask.

17. A method comprising:

providing a platen coupled to a rotatable assembly of a roplat, the platen configured to hold a workpiece;

providing a bracket directly affixed to the rotatable assembly; and positioning a mask adjacent the platen, wherein the mask is directly coupled to the bracket, and wherein the mask covers an inner portion of the platen and the workpiece, leaving just an outer circumferential edge of the workpiece exposed to an ion treatment.

18. The method of claim 17, further comprising:

determining a mask center and a workpiece center; and positioning the workpiece between the mask and the platen, wherein the mask center is aligned with the workpiece center.

19. The method of claim 18, further comprising verifying, using an imaging device, alignment of the mask center with the workpiece center.

20. The method of claim 17, further comprising performing the ion treatment to the exposed outer circumferential edge of the workpiece while the workpiece and the platen are rotated relative to the mask.

* * * * *